US006762942B1

(12) United States Patent
Smith

(10) Patent No.: US 6,762,942 B1
(45) Date of Patent: Jul. 13, 2004

(54) BREAK AWAY, HIGH SPEED, FOLDED, JUMPERLESS ELECTRONIC ASSEMBLY

(76) Inventor: Gary W. Smith, 12376 Darkwood Rd., San Diego, CA (US) 92129

( * ) Notice: Subject to any disclaimer, the term of this patent is extended or adjusted under 35 U.S.C. 154(b) by 0 days.

(21) Appl. No.: 10/235,408

(22) Filed: Sep. 5, 2002

(51) Int. Cl.$^7$ .................................................. H05K 1/00
(52) U.S. Cl. ...................... 361/749; 361/760; 361/720; 361/736; 361/748; 174/258; 174/260; 174/262; 257/686
(58) Field of Search ................................. 361/749, 720, 361/736, 748, 760; 174/258, 260, 262; 257/686, 712

(56) References Cited

U.S. PATENT DOCUMENTS

| | | | | |
|---|---|---|---|---|
| 5,224,023 A | * | 6/1993 | Smith et al. ................. 361/784 |
| 5,754,409 A | * | 5/1998 | Smith ......................... 361/803 |
| 5,949,657 A | * | 9/1999 | Karabatsos ................. 361/803 |
| 6,021,048 A | * | 2/2000 | Smith ......................... 361/736 |

* cited by examiner

Primary Examiner—David Martin
Assistant Examiner—Hung Bui
(74) Attorney, Agent, or Firm—Thomas J. Tighe, Esq.; Howard C. Tarr, Esq.

(57) ABSTRACT

Two substrate leaves are coupled by a folded flexible circuit medium. Integrated circuit components can be mounted to opposite faces of both leaves. A signal terminal projects from one of the leaves. Both leaves include paths for communicating signals between their respective components and the terminal. Preferably the leaves are formed by two outer, rigid substrates each laminarly affixed to a respective inner substrate, the inner substrates being separate sections of the folded circuit medium and the outer substrates being separated sections of a rigid circuit medium. Components are mounted to the exposed faces of the substrates. The fold includes paths for communicating signals between the leaf distal from the terminal and the terminal, the signal paths between one leaf and the terminal being closely matched in length and impedance to corresponding paths between the other leaf and the terminal.

20 Claims, 5 Drawing Sheets

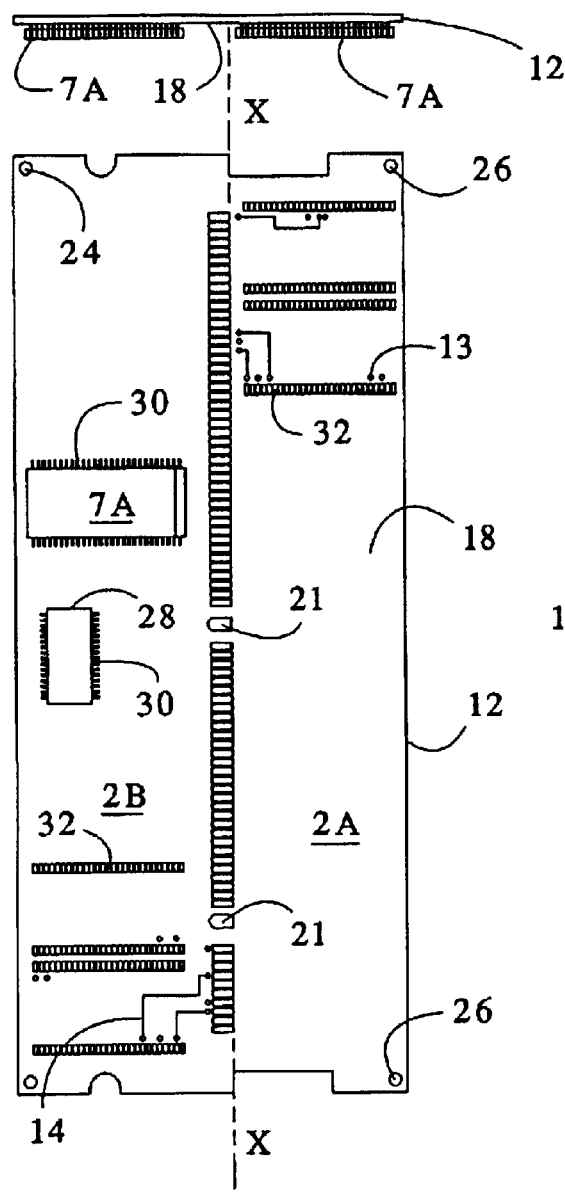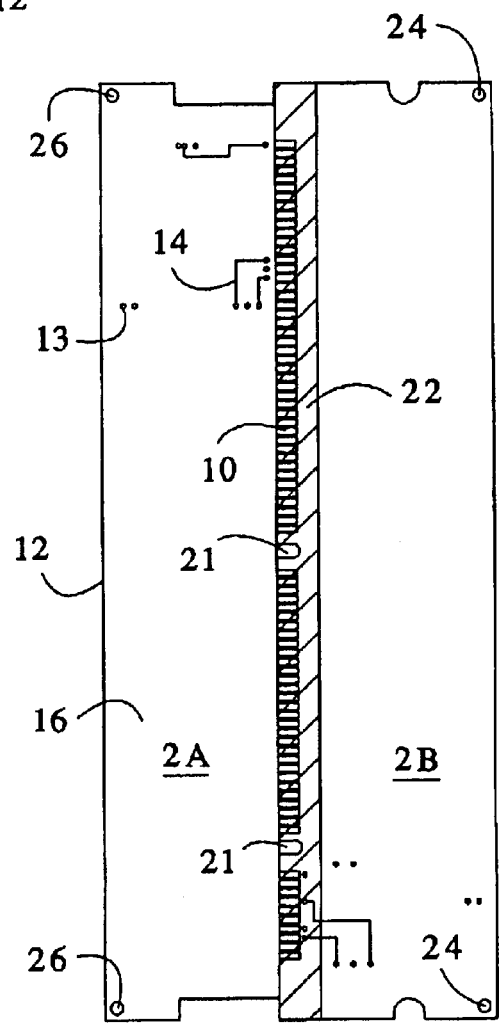
FIG. 2
FIG. 3

BREAK AWAY, HIGH SPEED, FOLDED, JUMPERLESS ELECTRONIC ASSEMBLY

FIELD OF THE INVENTION

This invention relates in general to the art of electronic packaging for high speed circuits, and more specifically to the packaging of electronic integrated printed circuits into assemblies, e.g. memory modules or other types of modular electronic assemblies.

BACKGROUND OF THE INVENTION

Computers over time have increased in functionality and decreased in size. Driving this has been the miniaturization of circuitry and the maximum utilization of space through clever and innovative packaging techniques. Additionally, computer systems have become faster and, as a result, the need for higher speed packaging solutions has become necessary. This is particularly true for memory arrays. In computers there are two types of memory, read-only memory (ROM) and random access memory (RAM). RAM is used as a temporary work space for software applications to store data that is currently being worked on, such as documents, pictures and the like. Because of the evolution of more complex software applications, a requirement for larger and larger amounts of RAM has developed.

Computers are designed to accommodate the need for expansion of RAM by employing a packaging technique known as a "memory module". Memory modules come in various configurations and types, and are commonly known as SIMMs (Single Inline Memory Module), DIMMs (Dual Inline Memory Module), and SODIMMs (Small Outline Dual Inline Memory Module) to name a few. Memory modules are separate electronic assemblies comprised of a plurality of memory integrated circuits and support circuitry such as line drivers, FETs or buffers, clock drivers or interface logic that is mounted on a printed wiring board. The printed wiring board has a plurality of connecting pads along one edge so that these assemblies can be installed in the computer by plugging them into connectors or sockets. A number of sockets are placed on computer motherboards so that the computer user may easily add or upgrade their RAM. The prior art has developed a foldable electronic module assembly specifically to take advantage of the assembly on which to mount extra memory components and to minimize the space consumed by the assembly. An example of this technique is found in U.S. Pat. No. 5,224,023, the '023 patent, wherein a pair of quadrangular printed wiring boards are each laminarly split and mounted on both sides of a flexible insulating substrate having a network of conductive leads and connecting stations applied thereto. The half-sections of boards are adapted to have memory chips mounted thereon and sandwich the substrate therebetween. A pair of spaced-apart folds is made in the substrate so that it takes on an "S" shape that is squeezed together to save space. One of the outside half-sections of printed wiring boards has a comb of connecting terminals formed along one free edge that is plugged into a socket on the motherboard.

While this foldable electronic module assembly saves room inside the computer enclosure and allows the addition of RAM and other components to the already crowded interior of the computer system, it does not solve additional problems brought on by the demands of high performance, high speed computers systems. In the foldable module of the '023 patent, the memory components on each successive section are located further and further distances from the interconnect point with the motherboard. As the speed of the memory data bus is increased in computer systems in order to increase the performance of the system, the successive increase in travel distance caused by the physical arrangement of the memory components of the '023 patent induces a propagation delay that compromises or diminishes signal integrity of the memory system. It is necessary in high performance memory systems to make the trace lengths as short as possible and as equal in length as possible. The invention described below solves the trace length problems found in memory modules of the type in the '023 patent or other types in the industry that are described as board-stacking memory modules.

In the variation of the folded module type found in U.S. Pat. No. 5,949,657 "Bottom or top jumpered foldable electronic assembly," and other inventions that describe high-density memory module packaging schemes of board stacking, the attachment of a second rigid printed wiring assembly to the first is accomplished by means of soldering jumper wires, connectors or pins of various types between the two assemblies.

The invention described below provides a plurality of leaves upon which are mounted integrated circuit ("IC") components, but which eliminates the need for additional interconnect means between the leaves because a flexible substrate itself is the means by which a mechanical and electrical connection from one component mounting leaf to another such leaf is accomplished. Furthermore the interconnect length from a signal/power terminal, e.g. a connector edge, to each leaf is achieved in as short a distance as possible. This approach significantly increases the reliability of the completed assembly by eliminating numerous solder joints and the required jumpers. In addition, the flexible substrate is preferably constructed with a ground plane on one of its layers such that each high speed signal trace has a direct return path and is spaced appropriately from the ground plane to achieve desired impedance matching characteristics required by high speed applications. Variations that incorporate jumper wires, connectors or pins do not have this signal integrity capability. In addition, a modular assembly according to this invention is maintained on a single interconnect substrate that is built and tested as one integral part, thereby reducing the assembly costs when compared to other methodologies.

While the description of the preferred embodiment below addresses assemblies of a high speed, high density memory modules, this invention is applicable as well to other types of modular electronic assemblies.

SUMMARY OF THE INVENTION

An object of this invention is to provide a means of reducing the propagation delay from a plurality of high speed, compactly packaged IC components to a computer processor or other circuit. Further objects of this invention are to provide: a means of increasing the memory capacity of memory modules; a high-speed, high density, modular electronic assembly; a packaging technique for assembling modular electronic assemblies in a compact arrangement which does not require substantial space allocation for future expansion; a packaging technique for assembling memory modules to allow the fabrication of memory modules of different capacities in the same compact package configuration such as SIMM, DIMM, SODIMM or the like; a means for efficiently upgrading existing computers by employing space-saving technology without deterioration of signal integrity between an expanded memory and a computer processor; and a "low-profile" memory module configuration that is high speed. A further object of this invention is to provide a high speed electronic assembly that solves multiple problems: the problem of space by providing heretofore unavailable compact electronic assemblies, and the problem of unbalanced data/control trace lengths which are caused by non-uniform lengths of signal traces inherent between successive arrays of memory components of a conventional folded electronic assembly. A further object of this invention is to provide a modular electronic assembly which accomplishes over the prior art the shortest possible trace lengths between a plurality of folded IC component leaves and a signal/power terminal by which assembly communicates with a processor or other circuit These objects, and others unlisted above but readily discernible upon a reading of this document while viewing the appended drawings, are accomplished by a preferably pluggable electronic assembly which includes: two IC component substrate leaves; a fold coupling the two leaves together in parallel, spaced relation; a plurality of IC components distributed over and coupled to the faces of the leaves; a signal terminal projecting from one of the leaves; both leaves including signal paths for communicating signals between their respective IC components and the terminal; and the fold including signal paths for communicating signals between the leaf distal from the terminal and the terminal. Preferably the invention comprises four IC component substrates sandwiched together, the two outer substrates being rigid, the two inner substrates being separate sections of a folded flexible circuit medium; adjacent inner and outer substrates being affixed together forming two spaced leaves joined by the fold of the flexible medium with the components being distributed over and coupled to the un-affixed faces of the substrates. Preferably the folded flexible circuit medium further comprises a continuous signal reference plane. e.g. a ground plane, and power paths. Also preferably the inner substrate proximal to the terminal includes signals paths for communicating signals between its IC components and the terminal via corresponding signal paths in or on said one of the outer substrates; and both substrates distal from the terminal include signal paths for communicating signals between their respective IC components and the terminal via corresponding signal paths in or on the fold. As illustrated hereinafter the preferred embodiment includes two or more folded, separate component mounting leaves having substantially balanced signal traces, i.e., generally uniform data and uniform control signal path lengths, between the sections' respective components and the signal terminal by which the module is signal (data and control) coupled to a processor or other circuit.

The scope of protection sought by the inventor may be gleaned from a fair reading of the claims that conclude this specification.

BRIEF DESCRIPTION OF THE DRAWINGS

FIGS. 2 and 3 are illustrative plan views of the opposing faces of a rigid first planar, multi-layered printed circuit medium, the faces depicted in FIGS. 2 and 3 being referred-to hereinafter as "outside" and "inside" faces, respectively, of the first circuit medium solely for purposes of clarity. FIG. 2 includes an exploded edge view.

FIG. 4 includes an exploded edge view.

DESCRIPTION OF TIRE PREFERRED EMBODIMENTS

Figure 1:
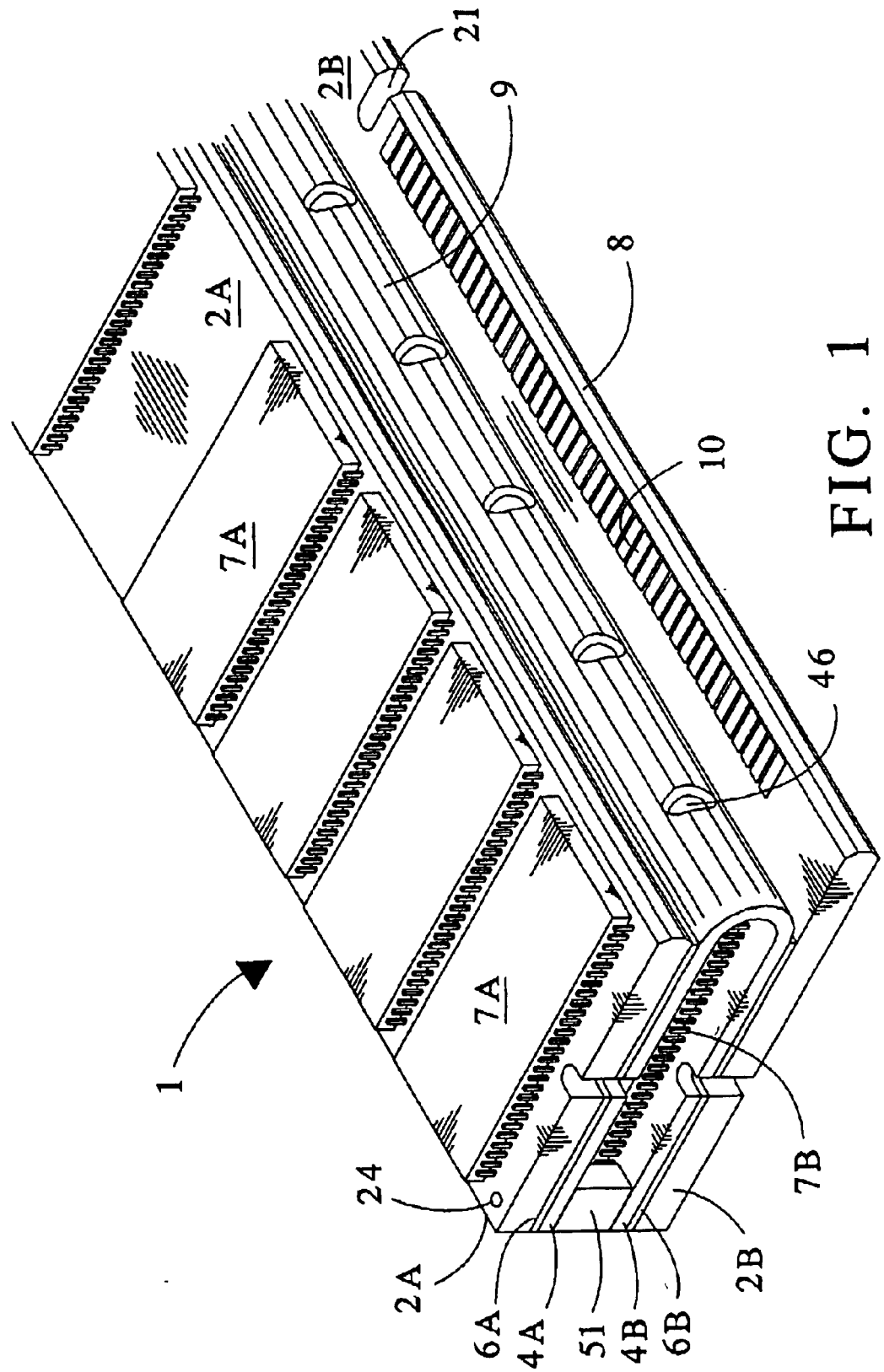
FIG. 1 is a partial pictorial view of the preferred embodiment of this invention.

Turning now to the drawings, where elements are identified by numerals and like elements are identified by like numerals throughout, FIG. 1 illustrates a preferred memory module embodiment of this invention, generally designated 1, to include two major elements: (1) a planar, relatively rigid first circuit medium separated into two elongated, planar, memory component substrates, 2A and 2B, which are aligned parallel to each other in spaced relation, and (2) a flexible second circuit medium folded upon itself resulting in a substantially 180 degree fold 9 and two planar, parallel, spaced, separate memory component substrates, 4A and 4B, which are sandwiched between the first circuit medium's two substrate sections, 2A and 2B. Adjacent inner and outer substrates are affixed laminarly together, e.g. by a bonding laminate, forming two spaced leaves (54 and 56 of FIG. 8) joined by the fold 9 of the flexible medium. Mounted to un-affixed, outer faces of the first medium's substrates, 2A and 2B, are a plurality of memory components 7A, and mounted to the un-affixed, inner faces of the second medium's substrates, 4A and 4B, are a plurality of similar, or dissimilar as desired, memory components 7B. As illustrated, one of the rigid substrates 2B of the first circuit medium includes a signal terminal illustrated as a male card edge connector 8 projecting sufficiently beyond the sandwiched circuit media, and the fold 9 of the second circuit medium, to be pluggable into a mating female connector (e.g., item 62 of FIG. 9) for signal communication between the circuit media and, e.g, a processor memory bus, via a plurality of conductive lands 10 disposed along the leading edge of connector 8.

Referring to FIGS. 1–3, the structure of the first circuit medium, before it is separated and assembled as in FIG. 1, is illustrated to be a rigid, generally elongated, generally rectangular, multi-layered circuit board 12 of conventional printed circuit construction, each layer including electrically conductive paths, i.e., traces 14 for signal communication and plated-through holes or vias 13 for interconnecting the layers of the board. The thickness of the board 12 and the number of conductive layers and their function is determined by application or by design. The first medium board has two broad faces: and "inside" face 16 and "outside" face 18. A longitudinal axis X—X divides the board 12 into generally two half-sections, the memory component substrate 2A and the memory component substrate 2B, and axis X—X further delineates a partial mechanical cut or score 20 (FIG. 6) preferably made on the inside face 16 of the board. The lands 10 of the previously mentioned male card edge connector 8 (FIG. 1) are disposed on the opposing faces of the board along one side of the X—X axis, the size, pitch and number of connector lands 10 being determined application or by design. Also, appropriate connector alignment slots or key slots 21 are defined as through holes by the board 12 along the lands side of the axis X—X. In operation, the board 12 is broken, or otherwise separated, along the score 20 to separate the memory substrates, 2A and 2B, and to create the card edge connector 8.

Referring again to FIGS. 1–3, located on the inside face 16 of first medium's circuit board 12 is a laminate free area or laminate gap 22 (indicated by the cross-hatching) that in operation is kept void of any laminate material when the separated substrates, 2A and 2B, are bonded to their respectively facing substrates, 4A and 4B, of the flexible circuit medium. This laminate gap encompasses the area of the card edge connector 8. Also defined by the board 12 are a plurality of mounting alignment holes 24 and fastener mounting holes 26 as applications may require. Disposed on the outside face 18 of the board are substantially half of the memory components 7A and the support logic or other components 28 that comprise the circuitry demanded by the application. The leads 30 of the components are conductively affixed, e.g. by solder, to component mounting pads or lands 32 disposed on the outside face 18 of the board. It should be noted that solely for purposes of clarity of illustration only exemplary components, mounting pads, signal paths (e.g. conductive traces, vias) and other circuit elements are shown in FIGS. 2 and 3.

Figure 4:
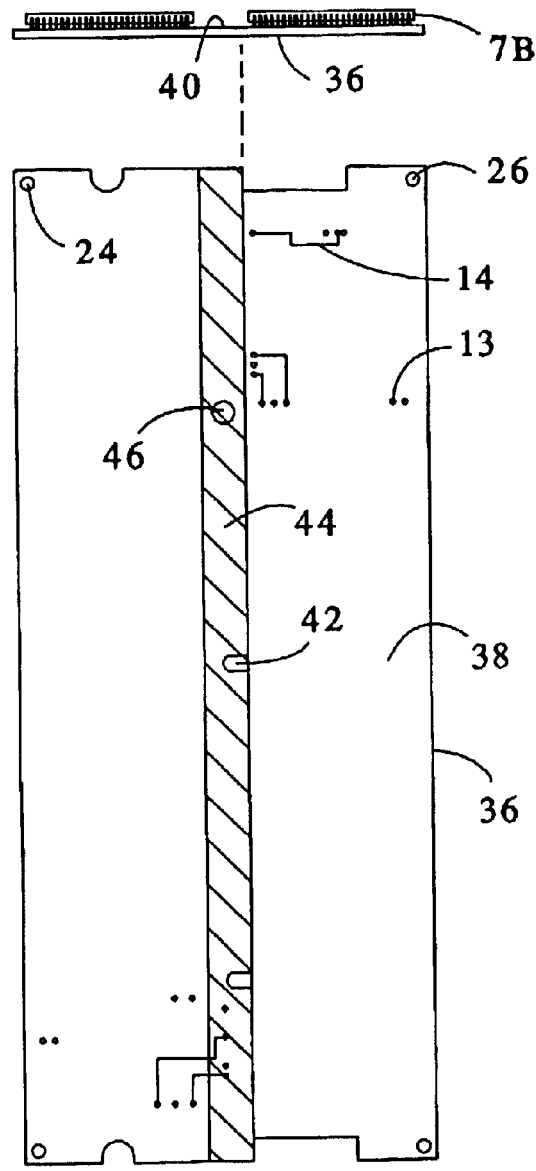
FIGS. 4 and 5 are illustrative plan views of the opposing faces of a flexible second planar, multi-layered printed circuit medium, the faces depicted in FIGS. 4 and 5 being referred-to hereinafter as "inside" and "outside" faces, respectively, of the second circuit medium solely for purposes of clarity.
Figure 5:
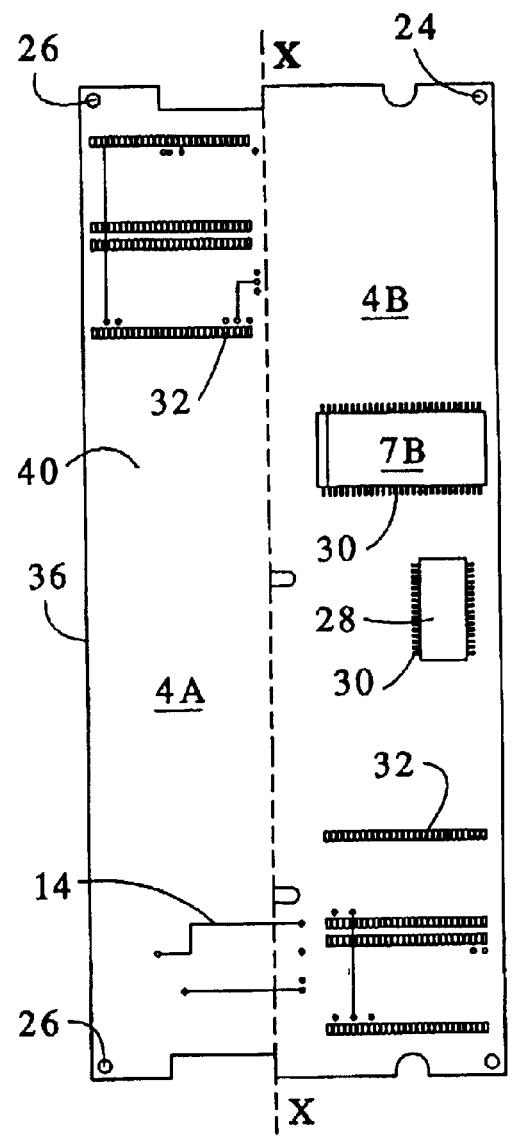

Referring to FIGS. 1, 4 and 5, the structure of the flexible second circuit medium 36, before it is folded and assembled as in FIG. 1, is illustrated to be generally elongated, generally rectangular, and multi-layered, of conventional flexible printed circuit construction, each layer including electrically conductive paths, i.e., traces 14 for signal communication and plated-through holes or vias 13 for interconnecting the layers of the second medium. The thickness of the second medium 36 and the number of conductive layers and their function is determined by application or by design. The second medium 36 has two faces: an "inside" face 38 and an "outside" face 40. Defined by the second medium and disposed as the application demands are connector alignment slots or key slots 42 which are aligned with the key slots 21 located on rigid medium 12 (FIG. 2). Located on the inside surface 38 of the flexible medium is a laminate free area or laminate gap 44 (illustrated by the cross-hatched area) that is kept void of any laminate material when the flexible medium is permanently attached to the separated substrates of the rigid medium. Also defined by the flexible medium are a plurality of mounting alignment holes 24 and fastener mounting holes 26, as applications may require, which align with the matching set of mounting alignment holes and the fastener mounting holes located on the rigid medium 12. Disposed on the outside face 40 of the flexible medium are substantially half of the memory components 7B and the support logic or other components 28 that comprise the circuitry demanded by the application. The leads 30 of the components are conductively affixed, e.g. by solder, to component mounting pads or lands 32 disposed on the outside face 40 of the flexible medium. It should be noted that solely for purposes of clarity of illustration only exemplary components, mounting pads, conductive traces, vias, and other circuit elements are shown in FIGS. 4 and 5. The laminate free area 44 is also known as the flexible appendage or "flex gap." Defined by the flexible medium within the flex gap and along the X—X axis in locations appropriate to the specific module requirements and determined by application are vent holes 46 that permit airflow up from the bottom of the module assembly.

Figure 6:
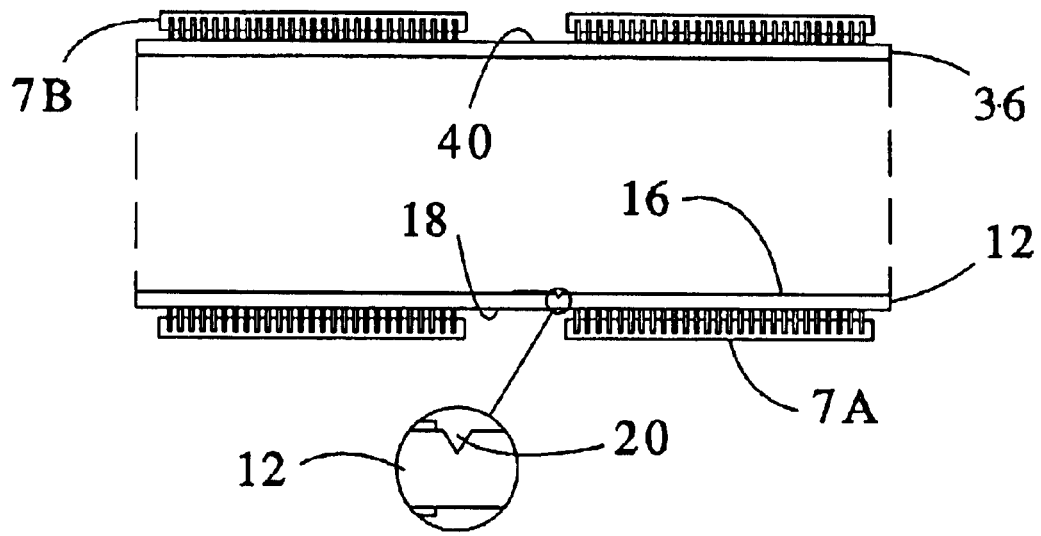
FIG. 6 is an illustrative exploded, short end, edge view of the first and second circuit mediums prior to lamination, and prior to severing the first circuit medium, as explained below. This figure includes a detail end view of a preferred longitudinal scoring of the first circuit medium along the X—X axis.

Referring to FIG. 6, the rigid medium 12 and the flexible medium 36 are illustrated in proper alignment and orientation just before the two are laminarly bonded together. Mounted on the corresponding outside faces of each medium, 18 and 40 respectively, are the appropriate memory components, 7A and 7B respectively, and support logic or other components. Also shown is an enlarged view of the partial cut or score 20 that is made on the inside face 16 of the rigid medium 12.

Figure 7:
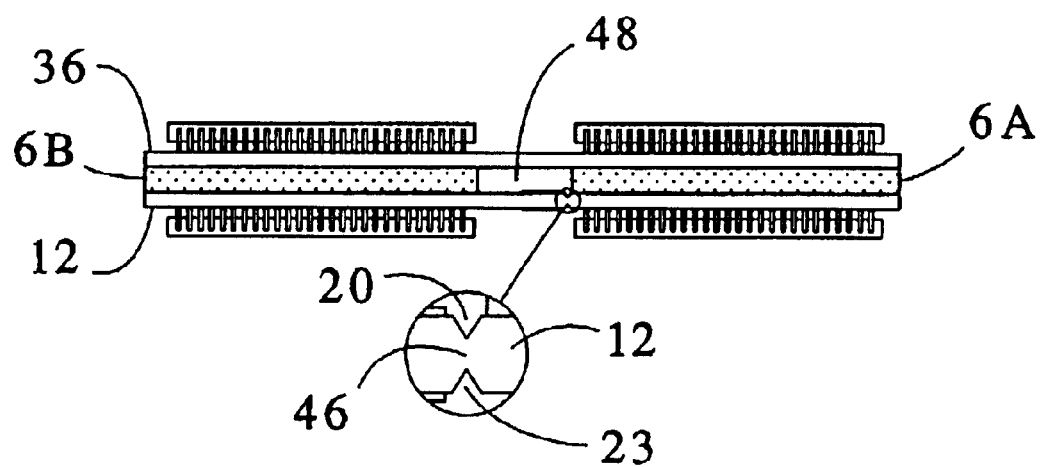
FIG. 7 is an illustrative edge view of the first and second circuit mediums after lamination, and prior to severing the first circuit medium, as explained below. This view includes a detail of a preferred longitudinal scoring of the first circuit medium.

Referring to FIG. 7, the rigid medium 12 and the flexible medium 36 are illustrated to be laminarly affixed together by laminates, 6A and 6B, as a further step of module assembly, before the assembly is folded. Also shown is an enlarged view of a breakaway 46 that is defined in the rigid medium 12 by score 20 on the inner face and a score 23 on the opposite face. The breakaway allows a clean break of the rigid medium along the X—X axis. Also illustrated is the laminate free area or laminate gap 48 created by the laminate free areas, 22 and 44 respectively, on the inside faces of the rigid medium and the flexible medium.

Figure 8:
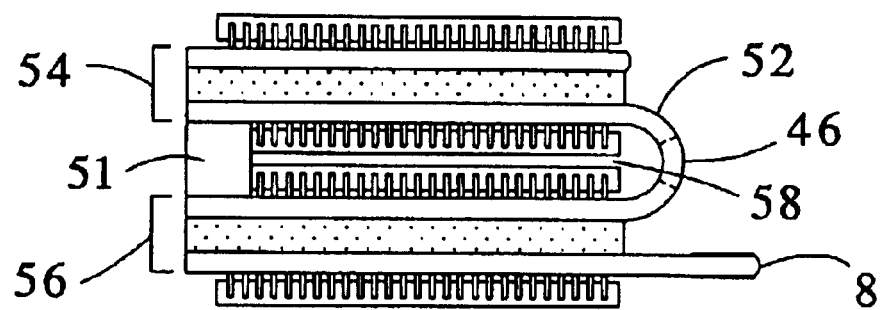
FIG. 8 is an illustrative end, i.e., edge view of the preferred embodiment of this invention in a fully assembled configuration.

Referring to FIG. 8, a fully assembled module according to this invention is illustrated in side view. Appropriate fasteners 51 have been applied to fix the folded assembly in place. The fasteners 51 mate with the fastener mounting holes 26 and mounting alignment holes 24 (shown in FIGS. 2–5) defined by the leaves' substrates for purposes of permanently attaching each leaf of the fold to the other. The means of attachment and fasteners used are determined by application or by design. Examples of fasteners 51 useful herein are metal or plastic standoffs, rivets, spacers, nut and bolt combinations and the like. The flexible appendage or flex gap 52 is set by specification of the particular application of the invention. Preferably the flex gap is set wide enough to allow mounting of both leaves, 54 and 56, in parallel, spaced relation when the flexible medium 36 is folded along the axis X—X (as shown in FIG. 2). Further, consideration is given to setting the width of the flex gap 52 at a distance that will allow a sufficient air space 58 between any opposite facing memory components for adequate heat dissipation.

Figure 9:
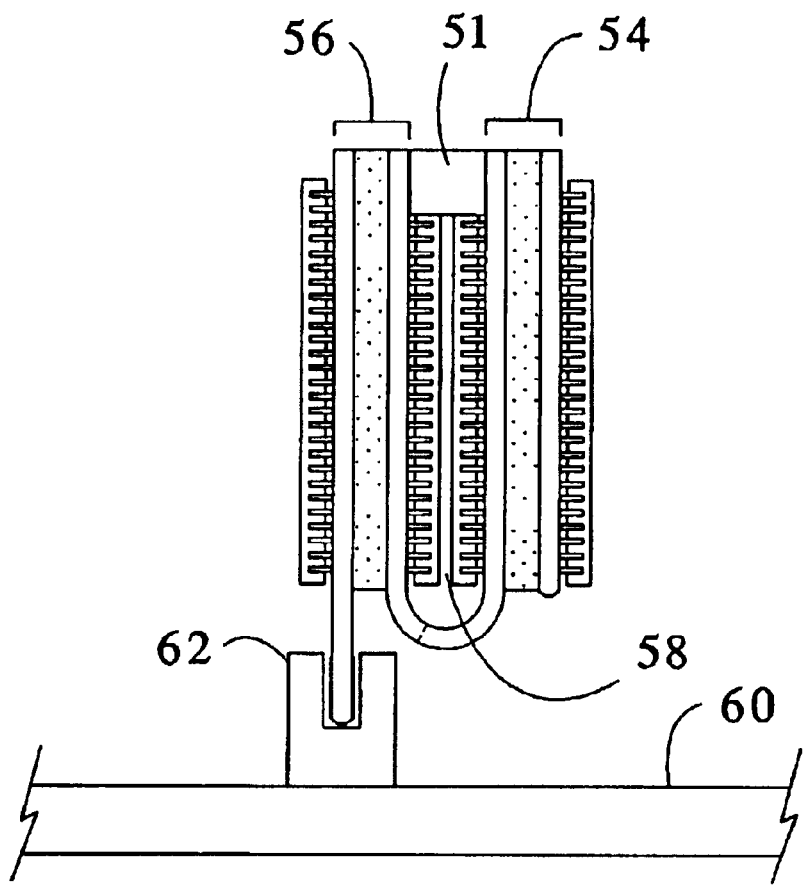
FIG. 9 is an illustrative end view of the invention, as illustrated in FIG. 8, showing the invention plugged into, e.g., a motherboard's memory bus's edge-receptive connector.

Referring to FIG. 9, the fully assembled module according to this invention is illustrated to be installed on an underlying support structure, e.g., a motherboard 60. This figure further shows flexible appendage 52 to be located as closely as possible to the card edge connector 8, which engages a female connecting port or socket 62 and interconnecting in as short a distance as possible both of the memory leaves, 54 and 56, which are mechanically attached to each other by fastener hardware 51, with a resulting air gap 58 therebetween.

Prior to assembly of the module, preferably after the first and second media are laminated together, the appropriate drilling of the key slots and vias is done and the vias are conductively plated. The vias and the signal paths they interconnect cooperate to provide signal paths for communicating memory access related signals between both substrate leaves, 54 and 56, their respective memory components, and the terminal 8, and preferably the fold 9 includes signal paths for communicating memory access related signals between the leaf 54 distal from the terminal and the terminal. Preferably the inner substrate 4B proximal to the terminal 8 includes signals paths for communicating memory access related signals between its memory components and the terminal via corresponding signal paths in or on the rigid substrate 2B to which it is laminated, and both substrates, 4A and 2A, distal from the terminal include signal paths for communicating memory access related signals between their respective memory components and the terminal via corresponding signal paths in or on the fold 9. Preferably all signal paths traversing the fold are on one side while the opposite side has a reference plane, e.g. a ground plane, for impedance and cross-talk purposes. This is a significant aspect of the invention because this arrangement balances the signal trace lengths of connections from the card edge connector 8 to the memory components, 7A and 7B, and other supporting components mounted on the rigid substrates, 2A and 2B, and furthermore, it significantly reduces the trace lengths of connections from the card edge connector 8. Where the prior art located memory components in successive sections of rigid sections interconnected by successive sections of flexible printed wiring in a series fashion, this innovation provides a high-speed memory module solution that connects them in a parallel fashion thereby permitting a method by which the data path from each separate to the flex gap 44 is minimized and balanced or nearly equal in length. The width of the flex gap 44 is so small that virtually no propagation delay is developed, and thereby there is no lessening or mitigation of the signal integrity of the memory module assembly.

While the invention has been described with reference to a particular embodiment thereof, those skilled in the art will be able to make various modifications to the described embodiment of the invention without departing from the true spirit and scope thereof For example, the mounted components in the preferred embodiment discussed above need not be memory components; they can be any variety of similarly leaf mountable circuits, e.g. integrated circuits or hybrid circuits, in which case the resultant assembly would nevertheless be a modular electronic assembly according to this invention. It is intended that all combinations of elements and steps which perform substantially the same function in substantially the way to achieve substantially the same result are within the scope of this invention.

I claim:

1. A modular electronic assembly comprising:
   (a) two component substrate leaves including respective substrate sections of a broken away rigid circuit medium;
   (b) a fold coupling the two leaves together in spaced relation;
   (c) a plurality of components distributed over, and coupled to, faces of the leaves;
   (d) a signal terminal projecting from one of the leaves;
   (e) both leaves including signal paths for communicating signals between their respective components and the terminal; and
   (f) the fold including signal paths for communicating signals between the leaf distal from the terminal and the terminal.

2. The modular electronic assembly according to claim 1 further comprising a plurality of spaced apertures defined through the fold for enabling cooling air flow over components within the space between the leaves.

3. The modular electronic assembly according to claim 1 wherein the fold is defined by a flexible circuit medium folded substantially 180 degrees, the flexible circuit medium including component substrates disposed beyond the fold which are an integral part of respective substrate leaves.

4. The modular electronic assembly according to claim 3 wherein each broken-away section of the rigid substrate medium is laminarly affixed to a respective flexible circuit medium component substrate.

5. The modular electronic assembly according to claim 3 wherein the fold further comprises a signal reference plane therein or thereon continuous with the flexible circuit medium substrates.

6. The modular electronic assembly according to claim 1 wherein the fold further comprises a signal reference plane therein or thereon continuous with respective reference planes of the leaves.

7. The modular electronic assembly according to claim 1 wherein the terminal comprises a connector edge, the edge being defined by the breaking away of the substrate sections of the rigid circuit medium.

8. A modular electronic assembly comprising:
   (a) four component substrates sandwiched together, the two outer substrates being rigid relative to the two inner substrates, the two inner subsumes being separate sections of a folded flexible circuit medium; adjacent inner and outer subsumes being laminarly affixed together forming two spaced leaves joined by the fold of the flexible circuit medium;
   (b) a plurality of components distributed over, and coupled to, the exposed faces of the substrates;
   (c) a signal terminal projecting from one of the outer substrates;
   (d) both leaves including signal paths for communicating signals between their respective components and the terminal; and
   (e) the fold including signal paths for communicating signals between the leaf distal from the terminal and the terminal.

9. The modular electronic assembly according to claim 8 wherein:
   (a) the inner substrate proximal to the terminal includes signals paths for communicating signals between its components and the terminal via corresponding signal paths in or on said one of the outer substrates; and
   (b) both subsumes distal from the terminal include signal paths for communicating between their respective components and the terminal via corresponding signal paths in or on the fold.

10. The modular electronic assembly according to claim 8 further comprising a plurality of spaced holes defined trough the fold for enabling ambient air flow over memory components within the space between the leaves.

11. The modular electronic assembly according to claim 9 further comprising a plurality of spaced holes defined through the fold for enabling ambient air flow over memory components within the space between the leaves.

12. The modular electronic assembly according to claim 8 wherein the fold further comprises a signal reference plane therein or thereon.

13. The modular electronic assembly according to claim 9 wherein the fold further comprises a signal reference plane therein or thereon.

14. The modular electronic assembly according to claim 8 wherein the outer substrates further comprise sections of a printed circuit board separated along an axis.

15. The modular electronic assembly according to claim 14 wherein the sections are separated by being broken along a breakaway defined by the printed circuit board along the axis.

16. The modular electronic assembly according to claim 14 wherein the terminal comprises a plurality of signal tabs disposed on the printed circuit board, the signal tabs being mutually aligned along one side with the axis and adjacent thereto.

17. The modular electronic assembly according to claim 15 wherein the terminal comprises a plurality of signal tabs disposed on the printed circuit board, the signal tabs being mutually aligned along one side with the axis and adjacent thereto.

18. A memory module comprising:
(a) two memory component substrate leaves including respective substrate sections of a broken away rigid circuit medium;
(b) a fold coupling the two leaves together in spaced relation;
(c) a plurality of memory components distributed over, and coupled to, faces of the leaves;
(d) a signal terminal projecting from one of the leaves;
(e) both leaves including signal paths for communicating memory access related signals between their respective memory components and the terminal; and
(f) the fold including signal paths for communicating memory access related signals between the leaf distal from the terminal and the terminal.

19. The memory module according to claim 1 wherein the fold is defined by a flexible circuit medium folded substantially 180 degrees, the flexible circuit medium including memory component substrates disposed beyond the fold which are an integral part of respective substrate leaves.

20. The memory module according to claim 19 wherein each broken-away section of the rigid substrate medium is laminarly affixed to a respective flexible circuit medium memory component substrate.

* * * * *